(12) United States Patent
Zhang et al.

(10) Patent No.: US 12,565,910 B2
(45) Date of Patent: Mar. 3, 2026

(54) ROTATING SHAFT MECHANISM AND FOLDABLE FLEXIBLE DISPLAY DEVICE

(71) Applicants:Chengdu BOE Optoelectronics Technology Co., Ltd., Sichuan (CN); BOE Technology Group Co., Ltd., Beijing (CN)

(72) Inventors: Jun Zhang, Beijing (CN); Zhihui Wang, Beijing (CN); Wei Qing, Beijing (CN); Chuankun You, Beijing (CN); Fengping Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 51 days.

(21) Appl. No.: 18/640,021

(22) Filed: Apr. 19, 2024

(65) Prior Publication Data

US 2024/0263669 A1     Aug. 8, 2024

Related U.S. Application Data

(63) Continuation of application No. PCT/CN2022/083796, filed on Mar. 29, 2022.

(51) Int. Cl.
*H05K 5/02*          (2006.01)
*F16C 11/04*         (2006.01)

(52) U.S. Cl.
CPC ............ *F16C 11/04* (2013.01); *H05K 5/0226* (2013.01)

(58) Field of Classification Search
None
See application file for complete search history.

(56) References Cited

U.S. PATENT DOCUMENTS 11,048,305 B1 *   6/2021   Ye ......................... G06F 1/1681
2020/0326751 A1 *  10/2020   Kim ...................... G06F 1/1616
(Continued)

FOREIGN PATENT DOCUMENTS

CN          106555815 A      4/2017
CN          207601679 U      7/2018
(Continued)

OTHER PUBLICATIONS

International Search Report and Written Opinion mailed on Jan. 4, 2023, in corresponding PCT/CN2022/083796, 14 pages.

*Primary Examiner* — Allen L Parker
*Assistant Examiner* — Christopher L Augustin
(74) *Attorney, Agent, or Firm* — XSENSUS LLP

(57)          ABSTRACT

A rotating shaft mechanism, including a mounting base and at least one rotating assembly each of which includes two rotating modules; a rotating module includes a supporting plate, a sliding plate and an elastic pressing mechanism; the supporting plate is rotatably connected to the mounting base; a surface of the supporting plate is provided with a first limiting portion and a second limiting portion; the first limiting portion and the second limiting portion are provided at intervals along the first direction; a portion of the sliding plate is rotatably connected to the mounting base, and another portion of the sliding plate is slidably connected to the supporting plate; and a distance between the end of the sliding plate away from the mounting base and the second limiting portion is proportional to a maximum angle to which the supporting plate is able to rotate.

20 Claims, 5 Drawing Sheets

(56)        References Cited

U.S. PATENT DOCUMENTS

| | | |
|---|---|---|
| 2021/0014989 A1 | 1/2021 | Hsu et al. |
| 2021/0274028 A1* | 9/2021 | Park .................... H04M 1/0216 |
| 2021/0307186 A1* | 9/2021 | Hong ..................... F16C 11/12 |
| 2022/0137675 A1* | 5/2022 | Kuramochi ........... G06F 1/1652 |
| | | 361/679.27 |
| 2022/0311843 A1* | 9/2022 | Kim ..................... G06F 1/1681 |
| 2024/0015909 A1* | 1/2024 | Peng ................... H05K 5/0226 |

FOREIGN PATENT DOCUMENTS

| | | |
|---|---|---|
| CN | 210715544 U | 6/2020 |
| CN | 112470097 A | 3/2021 |
| CN | 113452819 A | 9/2021 |
| CN | 113643612 A | 11/2021 |
| CN | 114038328 A | 2/2022 |
| WO | 2022/001833 A1 | 1/2022 |

* cited by examiner

ROTATING SHAFT MECHANISM AND FOLDABLE FLEXIBLE DISPLAY DEVICE

CROSS-REFERENCE TO RELATED APPLICATION

The present disclosure is a U.S. Continuation Application of International Application No. PCT/CN2022/083796, filed on Mar. 29, 2022, the entire contents of which are incorporated herein by reference.

TECHNICAL FIELD

The present disclosure relates to the field of display technology, and in particular, to a rotating shaft mechanism and a foldable flexible display device.

BACKGROUND

The flexible display screen has a bendable performance, so that it is possible that an intelligent terminal carrying a flexible display screen, such as a smart phone and a notebook product, can be switched between a folded state and an unfolded state.

It should be noted that the information disclosed in the above background part is only used to enhance the understanding of the background of the present disclosure, and therefore may include information that does not constitute the related art known to those of ordinary skills in the art.

SUMMARY

The objective of the present disclosure is to overcome the problem that there is a raised or recessed crease on the flexible display panel due to the fact that the length of the bending region of the flexible display panel is inconsistent with the width of the hinge mechanism, and to provide a rotating shaft mechanism that can be fixed at any folding angle, and a foldable flexible display device.

According to an aspect of the present disclosure, there is provided a rotating shaft mechanism, including a mounting base and at least one rotating assembly. Each rotating assembly includes two rotating modules, the two rotating modules are symmetrically connected to two opposite sides of the mounting base along a first direction. A rotating module includes a supporting plate, a sliding plate and an elastic pressing mechanism. The supporting plate is rotatably connected to the mounting base, a surface of the supporting plate is used for supporting a flexible display panel, another surface of the supporting plate directly opposite to the surface is provided with a first limiting portion and a second limiting portion, and the first limiting portion and the second limiting portion are provided at intervals along the first direction. A portion of the sliding plate is rotatably connected to the mounting base, and another portion of the sliding plate is slidably connected to the supporting plate; an extending direction of a rotating axis of the sliding plate and an extending direction of a rotating axis of the supporting plate are both provided along a second direction and are parallel to each other; the second direction is perpendicular to the first direction; a portion of the sliding plate close to the mounting base is provided with a protruding portion; the protruding portion extends along the second direction and is located on a side of the first limiting portion close to the mounting base; and an end of the sliding plate away from the mounting base is opposite to the second limiting portion. The elastic pressing mechanism is provided along the second direction, an end of the elastic pressing mechanism is fixedly connected to the sliding plate, another end of the elastic pressing mechanism is slidably connected to the supporting plate, and the elastic pressing mechanism presses the sliding plate to enable the protruding portion to abut against the first limiting portion. The end of the sliding plate away from the mounting base is spaced apart from the second limiting portion; and a distance between the end of the sliding plate away from the mounting base and the second limiting portion is proportional to a maximum angle to which the supporting plate is able to rotate.

In some embodiments of the present disclosure, the rotating shaft mechanism further includes a torsion assembly, the torsion assembly includes a connecting rod, a sleeve, a pressing plate, a first elastic member and a limiting structure. The connecting rod is connected to the mounting base, and an extending direction of the connecting rod is provided along the second direction. The sleeve is fixed to an outer side of the connecting rod, and the sleeve rotates synchronously with the supporting plate. The pressing plate is sleeved on the connecting rod and fixed to a circumferential position of the connecting rod, and the pressing plate abuts against a side of the sleeve away from the mounting base. The first elastic member abuts against a side of the pressing plate away from the mounting base, and an end of the first elastic member away from the mounting base is fixedly provided. The limiting structure abuts against a side of the first elastic member away from the mounting base, and the limiting structure is fixed to the connecting rod. A positioning structure is provided between the pressing plate and the sleeve, so that when the sleeve stops rotating, the first elastic member presses the pressing plate to fix rotating positions of the pressing plate and the sleeve.

In some embodiments of the present disclosure, the positioning structure includes a plurality of grooves and a plurality of protrusions. The plurality of grooves is provided on a surface of the pressing plate in contact with the sleeve along a circumferential direction. The plurality of protrusions is provided on the sleeve and fitted with the plurality of grooves.

In some embodiments of the present disclosure, the positioning structure includes a plurality of grooves and a plurality of protrusions. The plurality of grooves is provided on a surface of the sleeve in contact with the pressing plate along a circumferential direction. The plurality of protrusions is provided on the pressing plate and fitted with the plurality of grooves.

In some embodiments of the present disclosure, the limiting structure includes a blocking member and a locking member. The blocking member is sleeved on the connecting rod and abuts against the side of the first elastic member away from the mounting base. The locking member is mounted on the connecting rod, a clamping groove is provided on a side of the connecting rod away from the blocking member, and the locking member is provided within the clamping groove and abuts against a side of the blocking member away from the mounting base.

In some embodiments of the present disclosure, the torsion assembly further includes a guide post and a second elastic member. The guide post is fixed to a side of the blocking member close to the mounting base and passes through the pressing plate. The second elastic member is sleeved outside the guide post and abuts against the blocking member and the pressing plate respectively.

In some embodiments of the present disclosure, the elastic pressing mechanism is provided on two sides of the sliding plate along the second direction, and the elastic pressing mechanism includes a mounting shaft and a third elastic member. An end of the mounting shaft is fixedly connected to a side of the protruding portion away from the mounting base, and another end of the mounting shaft is in clearance fit with the second limiting portion. The third elastic member is sleeved outside the mounting shaft, two ends of the third elastic member abut against the first limiting portion and the second limiting portion respectively.

In some embodiments of the present disclosure, the rotating shaft mechanism further includes a synchronous motion assembly; the synchronous motion assembly is used for driving the connecting rod, the sleeve and the supporting plate of the two rotating modules to rotate synchronously.

In some embodiments of the present disclosure, the synchronous motion assembly includes a transmission mechanism, and the transmission mechanism includes two first gears and a gear set. The two first gears are connected to two connecting rods in one to one correspondence, and the first gears and the connecting rods are coaxially provided. The gear set is engaged between the two first gears; when one of the first gears rotates, the gear set drives the other one of the first gears to rotate.

In some embodiments of the present disclosure, the gear set includes two second gears. The two second gears are engaged with the two first gears in one to one correspondence, and the two second gears are engaged with each other.

In some embodiments of the present disclosure, the synchronous motion assembly further includes a first connecting portion, a second connecting portion and a pin shaft. The first connecting portion is provided on the supporting plate, the first connecting portion is provided with a strip-shaped sliding groove, and the strip-shaped sliding groove gradually inclines towards a side away from the supporting plate along a direction close to the mounting base. The second connecting portion is sleeved on the connecting rod and extending towards a side close to the supporting plate along the first direction, and the second connecting portion is provided with a mounting hole. An end of the pin shaft is fixed within the mounting hole, and another end of the pin shaft is slidably connected into the strip-shaped sliding groove.

In some embodiments of the present disclosure, the mounting base is provided with an arc-shaped recess and an arc-shaped protrusion, an arc-shaped accommodating cavity is formed between the arc-shaped recess and the arc-shaped protrusion, a portion of the sliding plate connected to the mounting base is provided with an arc-shaped connecting portion, and the arc-shaped connecting portion is rotatably connected into the arc-shaped accommodating cavity.

In some embodiments of the present disclosure, a portion of the sliding plate connected to the supporting plate is provided with a plurality of strip-shaped holes along the first direction, a limiting member is provided within each strip-shaped hole respectively, and a distance between any two points on an end of the limiting member away from the sliding plate is larger than a width of the strip-shaped hole.

In some embodiments of the present disclosure, the rotating module further includes a cover plate, and the cover plate is provided on a side of the sliding plate and the elastic pressing mechanism away from the supporting plate.

In some embodiments of the present disclosure, a region of the supporting plate directly opposite to the sliding plate and the elastic pressing mechanism is lower than a remaining region of the supporting plate to form a mounting cavity for providing the sliding plate and the elastic pressing mechanism.

In some embodiments of the present disclosure, the rotating shaft mechanism includes two rotating assemblies, and the two rotating assemblies are symmetrically provided on two sides of the mounting base along the second direction.

According to another aspect of the present disclosure, there is provided a foldable flexible display device, including the rotating shaft mechanism according to the aspect of the present disclosure.

It should be understood that the above general description and the following detailed description are exemplary and explanatory only and are not intended to limit the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skills in the art, other drawings can also be obtained from these drawings without creative efforts.

Figure 1:
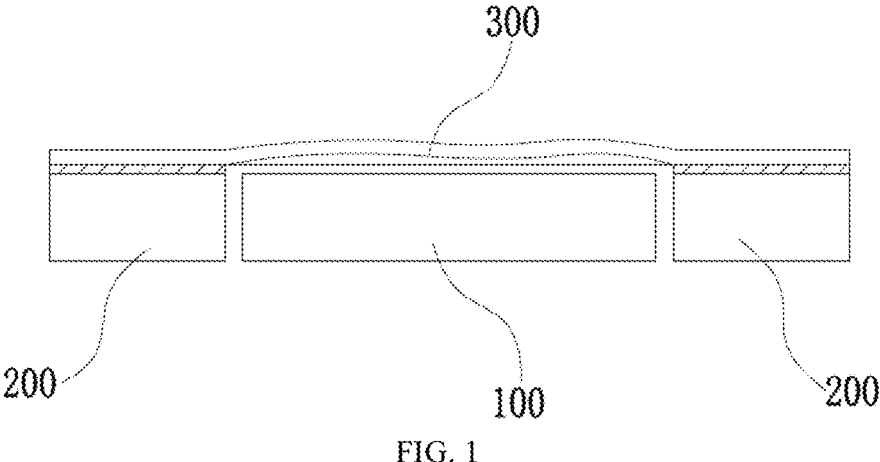
FIG. 1 is a schematic structural diagram of a foldable flexible display device involved in the related art after being used for a period of time.
Figure 2:
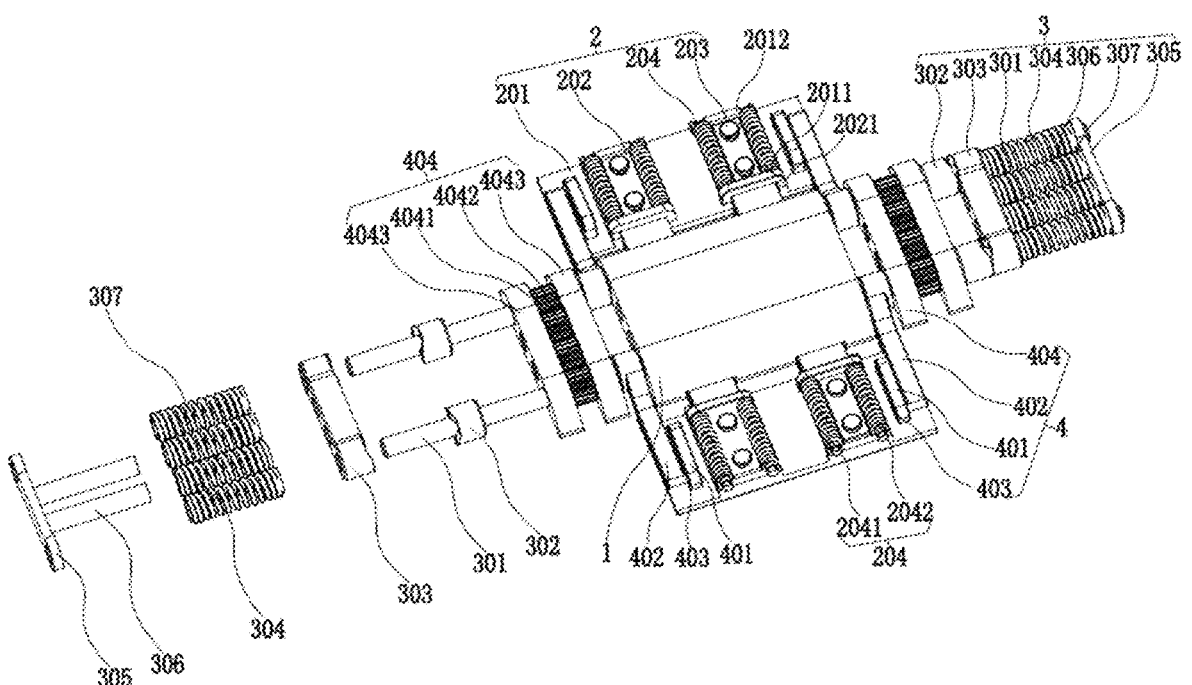
FIG. 2 is a perspective structural diagram of a rotating shaft mechanism according to some embodiments of the present disclosure.
Figures 3, 4:
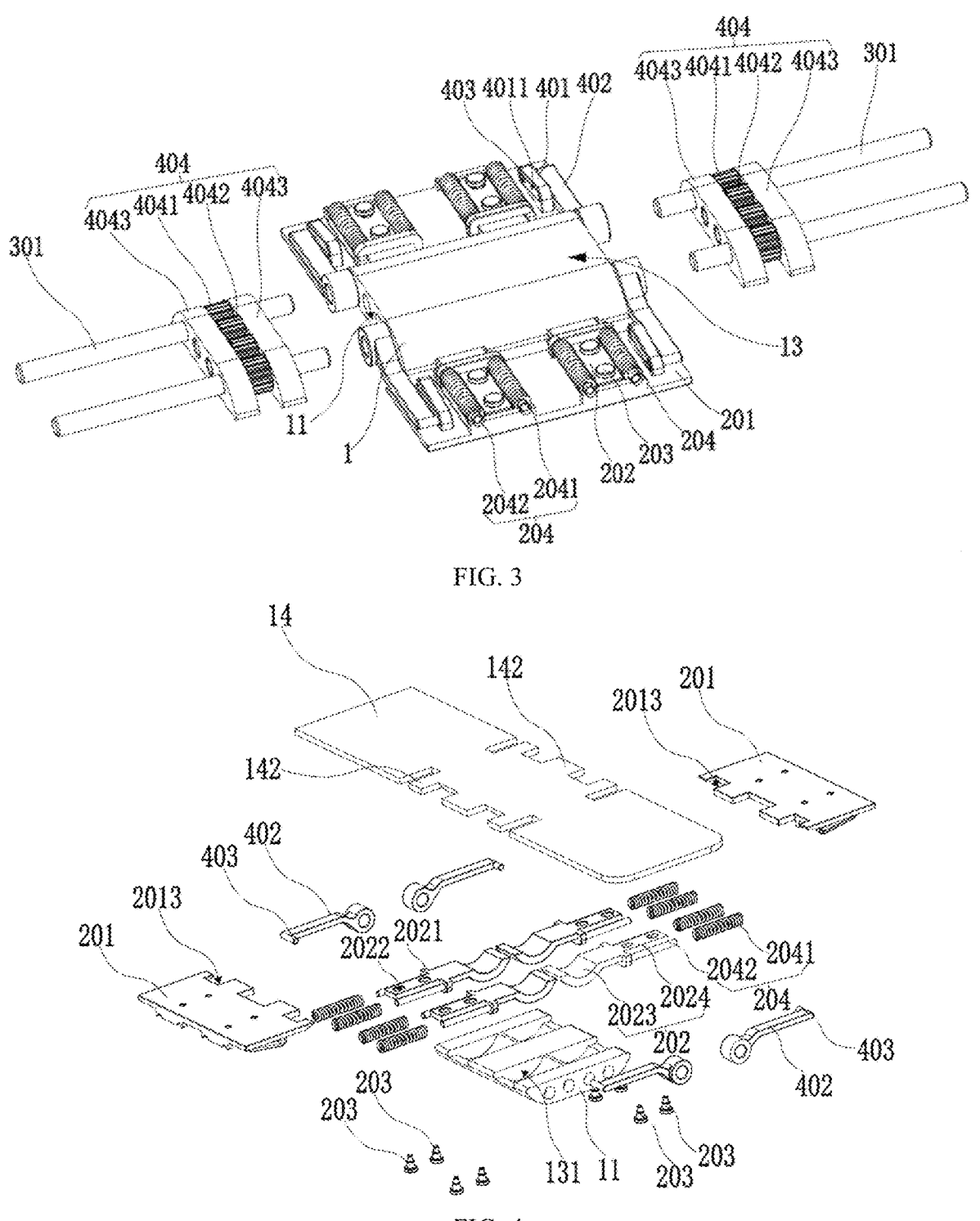
FIG. 3 is a perspective view of a partial structure of the rotating shaft mechanism according to some embodiments of the present disclosure.
FIG. 4 is an exploded view of a partial structure of the rotating shaft mechanism according to some embodiments of the present disclosure.

In the drawings: 1—Mounting base, 11—End plate, 12—Side plate, 13—Mounting plate, 131—Arc-shaped recess, 14—Baffle, 141—Arc-shaped protrusion, 142—Lug, 2—Rotating module, 201—Supporting plate, 2011—First limiting portion, 2012—Second limiting portion, 2013—Notch, 202—Sliding plate, 2021—Protruding portion, 2022—Strip-shaped hole, 2023—Arc-shaped connecting portion, 2024—Straight connecting portion, 203—Limiting member, 204—Elastic pressing mechanism, 2041—Third elastic member, 2042—Mounting shaft, 3—Torsion assembly, 301—Connecting rod, 302—Sleeve, 303—Pressing plate, 304—First elastic member, 305—Limiting structure, 306—Guide post, 307—Second elastic member, 4—Synchronous motion assembly, 401—First connecting portion, 4011—Strip-shaped sliding groove, 402—Second connecting portion, 403—Pin shaft, 404—Transmission mechanism, 4041—First gear, 4042—Second gear, 4043—Gear base, 10—Rotating shaft mechanism, 20—Baffle structure, 30—Encapsulation structure, 100—Hinge mechanism, 200—Middle frame, 300—Flexible display panel.

DETAILED DESCRIPTION

Example embodiments will now be described more fully with reference to the accompanying drawings. Example embodiments, however, can be implemented in various forms and should not be construed as limited to the embodiments set forth herein; by contrast, these embodiments are provided so that the present disclosure will be thorough and complete, and will fully convey the concept of example embodiments to those skilled in the art. The same reference numerals in the drawings denote the same or similar structures, and thus their detailed descriptions will be omitted. In addition, the drawings are merely schematic illustrations of the present disclosure, and are not necessarily drawn to scale.

Although relative terms such as "upper" and "lower" are used in the description to describe the relative relationship of one component to another component shown in the drawings, these terms are used in the description only for convenience, for example, according to the directions shown in the accompanying drawings. It may be appreciated that if the device shown in the drawings is turned over so that it is upside down, then the component described as being "upper" will become the component that is "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to indicate an open inclusion and means that there may be additional elements/components/etc. in addition to the listed elements/components/etc.; the terms "first", "second" and "third" etc. are only used as a marker, not a limitation on the number of its objects.

After a foldable mobile phone or a foldable notebook is used for a period of time, there may be creases of different degrees. This is because the length of the bending region of the flexible display panel is changed in the process of unfolding or folding the hinge mechanism. When the flexible display panel is unfolded, the length of the bending region is inconsistent with the width of the hinge mechanism. Since the strength of the flexible display panel is weaker than the strength of the hinge mechanism, there may be a raised or recessed crease on the flexible display panel. Currently, the foldable products sold on the market mainly include water-drop type foldable products and U-type foldable products. Among them, the matching performance between the water-drop type hinge mechanism and the flexible display panel is better. Therefore, the water-drop type foldable product has slighter creases compared with the U-type foldable product. However, the water-drop type hinge mechanism is complex in structure and too high in cost. The cost of a common water-drop type hinge mechanism is about 3 times of the cost of a U-type hinge mechanism.

In the related art, before the foldable product is used, the width of the hinge mechanism 100 is the same as the length of the bending region of the flexible display panel 300, and the flexible display panel 300 is flat with no creases. After the foldable product is used for a period of time, as shown in FIG. 1, since the width of the hinge mechanism 100 does not match with the length of the bending region of the flexible display panel 300 in the process of unfolding or folding, the hinge mechanism 100 may pull or press the flexible display panel 300, causing the length of the bending region of the flexible display panel 300 to be elongated, so that the length of the bending region of the flexible display panel 300 changes. When the flexible display panel 300 is unfolded to 180° again, the length of the bending region of the flexible display panel 300 is inconsistent with the width of the hinge mechanism 100. Since the strength of the flexible display panel 300 is weaker than the strength of the hinge mechanism 100, there may be a raised or recessed crease on the flexible display panel.

Based on this, there is provided a rotating shaft mechanism according to embodiments of the present disclosure. As shown in FIG. 2 to FIG. 7, the rotating shaft mechanism includes a mounting base 1 and at least one rotating assembly, and each rotating assembly includes two rotating modules 2. The two rotating modules 2 are symmetrically connected to two opposite sides of the mounting base 1 along a first direction. The rotating module 2 includes a supporting plate 201, a sliding plate 202 and an elastic pressing mechanism 204. The supporting plate 201 is rotatably connected to the mounting base 1, a surface of the supporting plate 201 is used for supporting the flexible display panel, and another surface of the supporting plate 201 opposite to the surface is provided with a first limiting portion 2011 and a second limiting portion 2012. The first limiting portion 2011 and the second limiting portion 2012 are provided at intervals along the first direction. A portion of the sliding plate 202 is rotatably connected to the mounting base 1, and another portion of the sliding plate is slidably connected to the supporting plate 201. The extending direction of the rotating axis of the sliding plate 202 and the extending direction of the rotating axis of the supporting plate 201 are both provided along a second direction and parallel to each other, and the second direction is perpendicular to the first direction. The portion of the sliding plate 202 close to the mounting base 1 is provided with a protruding portion 2021, and the protruding portion 2021 extends along the second direction and is located on the side of the first limiting portion 2011 close to the mounting base 1. The end of the sliding plate 202 away from the mounting base 1 is opposite to the second limiting portion 2012. The elastic pressing mechanism 204 is provided along the second direction, an end of the elastic pressing mechanism 204 is fixedly connected to the sliding plate 202, and another end of the elastic pressing mechanism 204 is slidably connected to the supporting plate 201. The elastic pressing mechanism 204 presses the sliding plate 202 to enable the protruding portion 2021 to abut against the first limiting portion 2011. The end of the sliding plate 202 away from the mounting base 1 is spaced apart from the second limiting portion 2012, and the distance between the end of the sliding plate 202 away from the mounting base and the second limiting portion 2012 is proportional to the maximum angle to which the supporting plate 201 can rotate.

A surface of the supporting plate 201 is provided with a first limiting portion 2011 and a second limiting portion 2012. The portion of the sliding plate 202 close to the mounting base 1 is provided with a protruding portion 2021, and an end of the sliding plate 202 away from the mounting base 1 is opposite to the second limiting portion 2012. An end of the elastic pressing mechanism 204 is fixedly connected to the sliding plate 202, and another end of the elastic pressing mechanism 204 is slidably connected to the supporting plate 201. The elastic pressing mechanism 204 presses the sliding plate 202 to enable the protruding portion 2021 to abut against the first limiting portion 2011. An end of the sliding plate 202 away from the mounting base 1 is spaced apart from the second limiting portion 2012. Under the action of an external force, the supporting plates 201 are close to each other; for example, it may be implemented through a fixture. Specifically, two supporting plates 201 may be pressed by using a fixture, so that the two supporting plates are close to the mounting base 1; and at this moment, the second limiting portion 2012 slides towards the end of the sliding plate 202 away from the mounting base. When the end of the sliding plate 202 away from the mounting base abuts against the second limiting portion 2012, the flexible display panel is attached to a surface of the supporting plate 201. When the flexible display panel is bent, the supporting plates 201 are close to each other, and the distance between the protruding portion 2021 and the first limiting portion 2011 gradually decreases with the rotation of the supporting plate 201. The supporting plate 201 is usually connected to the middle frame, and the flexible display panel is attached to the middle frame. Under the action of the elastic force of the elastic pressing mechanism 204, the flexible display panel is always kept in a tensioned and straightened state.

Figure 5:
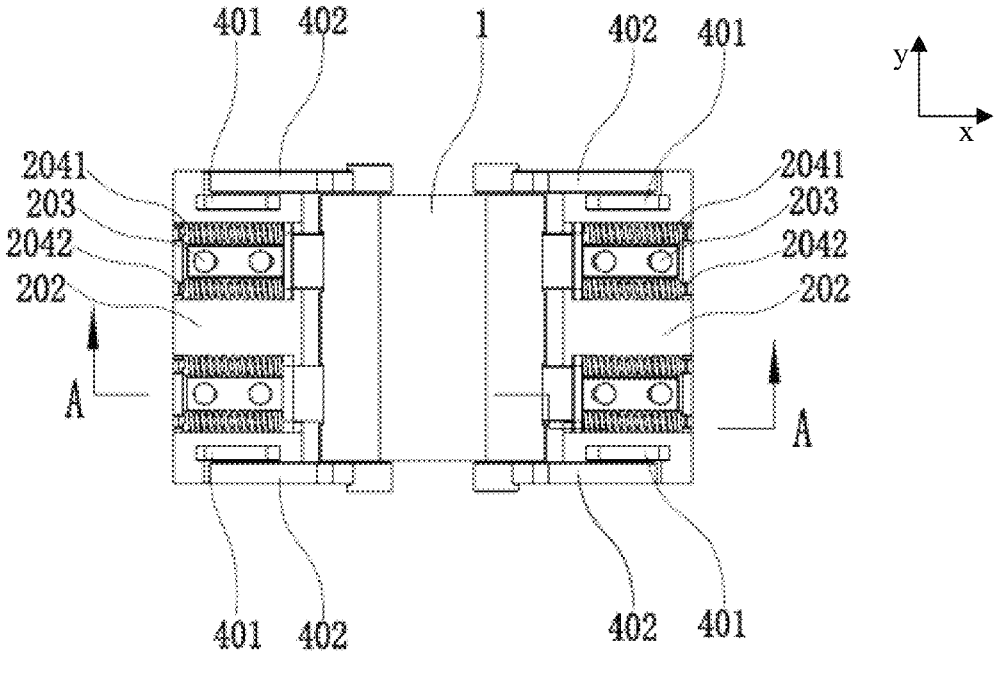
FIG. 5 is a top view of a partial structure of the rotating shaft mechanism according to some embodiments of the present disclosure.
Figure 6:
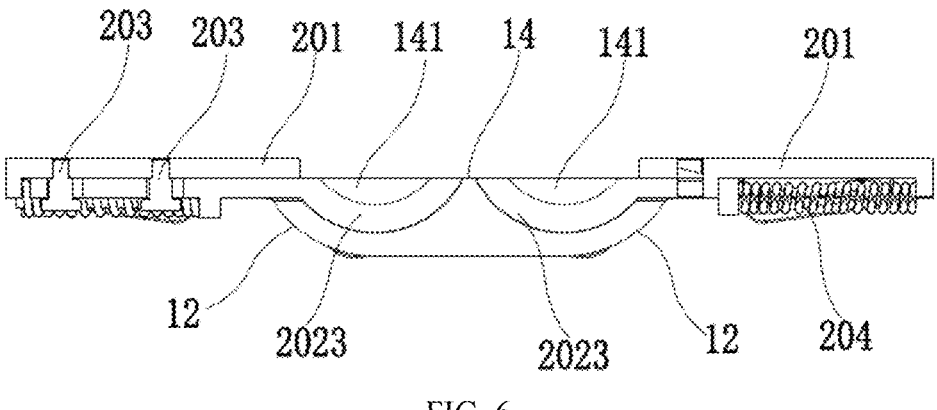
FIG. 6 is a cross-sectional view of FIG. 5 taken along line A-A.

It should be noted that the first direction is the x direction shown in FIG. 5, and the second direction is the y direction shown in FIG. 5.

The rotating shaft mechanism includes a mounting base 1 and two rotating assemblies, and the two rotating assemblies are symmetrically provided on two sides of the mounting base 1 along the second direction. Each rotating assembly includes two rotating modules 2, the two rotating modules 2 are symmetrically connected to two opposite sides of the mounting base 1 along the first direction, and the supporting plates 201 of the two rotating modules located on the same side of the mounting base 1 may be integrally formed. The structures and mounting manners of the two rotating modules 2 in each rotating assembly are the same. The two rotating modules 2 may be controlled respectively, or may be controlled in a linkage manner.

As shown in FIG. 2 to FIG. 7, the mounting base 1 includes two end plates 11, two side plates 12, a mounting plate 13 and a baffle 14. The two end plates 11 are two flat plates provided oppositely, and the two side plates 12 are two arc-shaped plates provided oppositely. The mounting plate 13 and the baffle 14 are two flat plates provided oppositely. The two side plates 12 and the mounting plate 13 are sequentially connected end to end, between the two end plates 11 and perpendicular to the two end plates 11. The baffle 14 is connected to the sides of the two side plates 12 and the two end plates 11 away from the mounting plate 13.

The two supporting plates 201 are provided opposite to the mounting plate 13 and located on two opposite sides of the baffle 14 along the first direction. A portion of the supporting plate 201 is rotatably connected to the mounting base 1. Among them, the two supporting plates 201 are provided on the same plane, where the portions of the two supporting plates 201 connected to the mounting base 1 are close to each other and fit with the baffle 14, so that the two supporting plates 201 and the baffle 14 are approximately spliced into a large supporting plate, and the flexible display panel is attached to a side of the large supporting plate away from the mounting plate 13.

It should be noted that the two opposite sides of the baffle 14 along the first direction are respectively provided with a first connecting structure. The sides of the two supporting plates 201 close to the baffle 14 are respectively provided with a second connecting structure. The first connecting structure includes a plurality of lugs 142, the second connecting structure includes a plurality of notches 2013 matched with the various lugs 142, where the plurality of lugs 142 of the first connecting structure are provided within the corresponding notches 2013 of the second connecting structures. It can be understood that the plug fit between the two supporting plates 201 and the baffle 14 may be implemented through the first connecting structure and the second connecting structure.

A portion of the sliding plate 202 is rotatably connected to the mounting base 1, and another portion of the sliding plate 202 is slidably connected to the supporting plate 201. The extending direction of the rotating axis of the sliding plate 202 and the extending direction of the rotating axis of the supporting plate 201 are both provided along the second direction and parallel to each other, and the second direction is perpendicular to the first direction. Specifically, an arc-shaped recess 131 is provided on the mounting plate 13, a portion of the sliding plate 202 connected to the mounting base 1 is provided with an arc-shaped connecting portion 2023, and the arc-shaped connecting portion 2023 is rotatably connected within the arc-shaped recess 131. An arc-shaped protrusion 141 is provided on the side of the baffle 14 opposite to the mounting plate 13, the arc-shaped protrusion 141 matches with the arc-shaped recess 131, and the arc-shaped connecting portion 2023 is limited within the arc-shaped accommodating cavity between the arc-shaped protrusion 141 and the arc-shaped recess 131. The sliding plate 202 further includes a straight connecting portion 2024, and the flat connecting portion 2024 is connected to an end of the arc-shaped connecting portion 2023 away from the mounting base 1 along the first direction. The straight connecting portion 2024 penetrates out of the side plate 12 of the mounting base 1 and is slidably connected to the supporting plate 201.

Another surface of the supporting plate 201 directly opposite the surface the supporting plate 201 configured to support the flexible display panel is provided with a first limiting portion 2011 and a second limiting portion 2012. The first limiting portion 2011 and the second limiting portion 2012 are provided at intervals along the first direction. The portion of the straight connecting portion 2024 close to the mounting base 1 is provided with a protruding portion 2021, the protruding portion 2021 extends towards two sides of the straight connecting portion 2024 along the second direction, and the protruding portion 2021 is located on the side of the first limiting portion 2011 close to the mounting base 1. The end of the sliding plate 202 away from the mounting base 1 is opposite to the second limiting portion 2012. The width of the straight connecting portion 2024 located on the side of the protruding portion 2021 away from the mounting base 1 is smaller than the width of the straight connecting portion 2024 located on the side of the protruding portion 2021 close to the mounting base 1.

The elastic pressing mechanisms 204 are provided on two sides of the straight connecting portion 2024 along the second direction. The elastic pressing mechanism 204 includes a third elastic member 2041 and a mounting shaft 2042. An end of the mounting shaft 2042 is fixedly connected to the side of the protruding portion 2021 away from the mounting base 1, and the other end of the mounting shaft 2042 is in clearance fit with the second limiting portion 2012 and is slidable relative to the supporting plate 201. The third elastic member 2041 is sleeved outside the mounting shaft 2042. The third elastic member 2041 presses the supporting plate 201, so that the first limiting portion 2011 abuts against the protruding portion 2021, the end of the sliding plate 202 away from the mounting base 1 is spaced apart from the second limiting portion 2012, and the distance between the end of the sliding plate 202 away from the mounting base and the second limiting portion 2012 is proportional to the maximum angle A to which the supporting plate 201 can rotate.

In order to ensure the matching reliability between the sliding plate 202 and the supporting plate 201, the portion of the sliding plate 202 connected to the supporting plate 201 is provided with a plurality of strip-shaped holes 2022 along the first direction. A limiting member 203 is provided within each strip-shaped hole 2022, and the limiting member 203 passes through the strip-shaped hole 2022 and is fixed to the supporting plate 201. The distance between any two points on the end of the limiting member 203 away from the sliding plate 202 is greater than the width of the strip-shaped hole 2022, and the length of the strip-shaped hole 2022 is generally greater than or equal to the distance between the end of the sliding plate 202 away from the mounting base and the second limiting portion 2012. It should be noted that the length of the strip-shaped hole 2022 refers to the size in the first direction, and the width of the strip-shaped hole 2022 refers to the size in the second direction.

The rotating shaft mechanism further includes a torsion assembly 3. The torsion assembly 3 includes a connecting rod 301, a sleeve 302, a pressing plate 303, a first elastic member 304, and a limiting structure 305. The connecting rod 301 is connected to the mounting base 1, and the extending direction of the connecting rod 301 is provided along the second direction. The sleeve 302 is fixed to the outer side of the connecting rod 301, and the sleeve 302 can rotate synchronously with the supporting plate 201. The pressing plate 303 is sleeved on the connecting rod 301 and fixed to the circumferential position of the connecting rod 301. The pressing plate 303 abuts against the side of the sleeve 302 away from the mounting base 1. The first elastic member 304 abuts against the side of the pressing plate 303 away from the mounting base 1, and the end of the first elastic member 304 away from the mounting base 1 is fixedly provided. The limiting structure 305 abuts against the side of the first elastic member 304 away from the mounting base 1, and the limiting structure 305 is fixed to the connecting rod 301. A positioning structure is provided between the pressing plate 303 and the sleeve 302, so that when the sleeve 302 stops rotating, the first elastic member 304 presses the pressing plate 303 to fix the rotating position between the pressing plate 303 and the sleeve 302.

The connecting rod 301 may pass through one of the end plates 11, and may also connect the connecting rod 301 to the arc-shaped protrusion 141. It can be understood that the connecting rod 301 may rotate relative to the mounting base 1. It is mentioned in the above that the extending direction of the connecting rod 301 is the same as the extending direction of the rotating axis of the supporting plate 201, so that the extending direction of the connecting rod 301 is perpendicular to the end plate 11. The extending direction of the connecting rod 301 and the extending direction of the rotating axis of the arc-shaped protrusion 141 may be provided on the same axis, or the extending direction of the connecting rod 301 and the extending direction of the rotating axis of the arc-shaped protrusion 141 may be provided on different axes.

The sleeve 302 is sleeved on the outer side of the connecting rod 301. When the connecting rod 301 can rotate relative to the mounting base 1, the sleeve 302 can be fixed relative to the connecting rod 301. For example, the sleeve 302 is in interference fit with the connecting rod 301, so that the sleeve 302 can rotate with the connecting rod 301. A bearing can be provided tween the connecting rod 301 and the mounting base 1, and the connecting rod 301 is rotatably connected to the mounting base 1.

In order to shorten the length of the connecting rod 301 as much as possible and reduce the axial size of the rotating shaft mechanism, the sleeve 302 may be close to the end plate 11 of the mounting base 1 as much as possible. It can be understood that the sleeve 302 is sleeved on the connecting rod 301 and is fixed relative to the connecting rod 301.

The pressing plate 303 abuts against the side of the sleeve 302 away from the mounting base 1. It should be noted that the pressing plate 303 can move along the axial direction of the connecting rod 301, but cannot rotate around the connecting rod 301. In order to improve the mounting efficiency, the pressing plates 303 of the two rotating modules 2 are provided as a whole, and two ends of the pressing plate 303 are respectively sleeved on the two connecting rods 301. It can be understood that, since the pressing plate 303 fits with the two connecting rods 301 at the same time, the pressing plate 303 does not rotate around the connecting rod 301.

A plurality of grooves is provided on the surface of the sleeve 302 in contact with the pressing plate 303 along the circumferential direction, and a plurality of protrusions is provided on the surface of the pressing plate 303 in contact with the sleeve 302 along the circumferential direction. Each protrusion may extend into the corresponding groove, so that the relative position between the sleeve 302 and the pressing plate 303 along the circumferential direction is fixed. Certainly, a plurality of grooves may also be provided on the surface of the pressing plate 303 in contact with the sleeve 302 along the circumferential direction, and correspondingly, a protrusion matching with the groove may be provided on the sleeve 302. The magnitude of the rotating force required when the pressing plate 303 rotates may be controlled by setting the protrusion degree of the protrusion and the depth of the groove.

The first elastic member 304 is sleeved on the connecting rod 301, and a limiting structure 305 is provided on the side of the first elastic member 304 away from the mounting base 1. The limiting structure 305 may be fixed to the connecting rod 301, thus fixing the first elastic member 304. The limiting structure 305 may include a blocking member, and the blocking member is sleeved on the connecting rod 301 and abuts against the side of the first elastic member 304 away from the mounting base 1. In other possible implementations, the blocking member may be detachably connected to the connecting rod 301. Specifically, a clamping groove may be provided on the side of the connecting rod 301 away from the blocking member, a locking member may be provided within the clamping groove, and the locking member may abut against the side of the blocking member away from the mounting base 1.

The torsion assembly 3 further includes a guide post 306 and a second elastic member 307. The guide post 306 is fixed on the side of the blocking member close to the mounting base 1, and is located between two connecting rods 301. The guide post 306 passes through the pressing plate 303; and the second elastic member 307 is sleeved outside the guide post 306 and abuts against the blocking member and the pressing plate 303, respectively. Double torsion may be achieved in the rotating shaft mechanism by increasing the number of the elastic members not the length and diameter of the non-elastic member, without changing the overall size of the rotating shaft mechanism. While the torsion is increased, the size of the rotating shaft mechanism is not increased, thus ensuring the lightening and thinning of the foldable product.

It should be noted that other mounting manners may also be adopted for the first elastic member 304 and the second elastic member 307. By taking the first elastic member 304 as an example for description, a mounting base 1 may be provided on the pressing plate 303 and the limiting structure 305, respectively; and the first elastic member 304 may be connected to the two mounting bases 1, respectively. The description here is merely illustrative and is not a limitation on the embodiments of the present disclosure. For example, other manners for fixedly providing the end of the first elastic member 304 away from the mounting base 1 may also be adopted. For example, the end of the first elastic member 304 away from the mounting base 1 may be directly fixed to the connecting rod 301. For example, the first elastic member 304 may be fixed to the connecting rod 301 by welding, etc.

The first elastic member 304 and the second elastic member 307 may be springs, and the blocking member is sleeved on the connecting rod 301. The locking member may be provided as an axial circlip, a clamping groove may be correspondingly provided on the connecting rod 301, and the locking member may be clamped within the groove. In order to improve the mounting efficiency, the limiting structures 305 of the two rotating modules 2 may 2 may also be provided as a whole, and two ends of the blocking member may be sleeved on the two connecting rods 301 respectively.

The locking member is provided with a disconnecting portion. When installed, the blocking member is firstly sleeved on the connecting rod 301, then the locking member is stretched out and sleeved on the connecting rod 301, and then the locking member is slid to the position of the clamping groove. The locking member may automatically deform and contract into the clamping groove to limit the position of the blocking member and prevent the blocking member from being disengaged from the clamping groove.

In the condition that the sleeve 302 is fixed relative to the connecting rod 301, when the supporting plate 201 rotates, the sleeve 302 and the connecting rod 301 are driven to rotate, and the pressing plate 303 remains stationary in the circumferential direction constantly, so that the sleeve 302 rotates relative to the pressing plate 303 constantly. When the supporting plate 201 stops rotating at a certain angle, the first elastic member 304 and the second elastic member 307 abutting against on the side of the pressing plate 303 away from the mounting base 1 press the pressing plate 303, so that the protrusion of the pressing plate 303 is clamped into the groove of the sleeve 302 to fix the position of the sleeve 302.

It can be understood that the connecting rod 301 may also be fixed relative to the mounting base 1. When the connecting rod 301 is fixed relative to the mounting base 1, the sleeve 302 may rotate relative to the connecting rod 301. When the supporting plate 201 rotates, the supporting plate 201 drives the sleeve 302 to rotate around the connecting rod 301. When the supporting plate 201 stops rotating at a certain angle, the first elastic member 304 and the second elastic member 307 abutting against on the side of the pressing plate 303 away from the mounting base 1 press the pressing plate 303, so that the protrusion of the pressing plate 303 is clamped into the groove of the sleeve 302 to fix the position of the sleeve 302 relative to the connecting rod 301.

When the two rotating modules 2 are in linkage control, the rotating shaft mechanism may further include a synchronous motion assembly 4. The synchronous motion assembly 4 is used to drive the connecting rods 301, the sleeves 302, and the supporting plates 201 of the two rotating modules 2 to rotate synchronously. The synchronous motion assembly 4 may include a transmission mechanism 404, the transmission mechanism 404 is connected to the mounting base 1, and the transmission mechanism 404 is used to drive the connecting rods 301 and the sleeves 302 of the two rotating modules 2 to rotate synchronously. It should be noted that, here, the connecting rod 301 is rotatably connected to the mounting base 1, and the sleeve 302 is in interference fit with the connecting rod 301, so that the connecting rod 301 of one rotating module 2 drives the connecting rod 301 of the other rotating module 2 to rotate, thus driving the sleeve 302 fitted with the connecting rod 301 of the other rotating module 2 to rotate.

The transmission mechanism 404 is provided between the sleeve 302 and the mounting base 1. The transmission mechanism 404 may include two gear bases 4043, two first gears 4041 and a gear set. The two connecting rods 301 sequentially pass through one gear base 4043, the two first gears 4041 and the other gear base 4043, and the gear set is engaged between the two first gears 4041. That is, the two first gears 4041 are connected to the two connecting rods 301 in one to one correspondence, the first gear 4041 and the connecting rod 301 are coaxially provided, the gear set is engaged between the two first gears 4041, and the two gear bases 4043 are respectively provided on two sides of the first gear 4041 and the gear set along the second direction. The axial positions of the first gear 4041 and the gear set may be limited to ensure the engagement between the first gear 4041 and the gear set.

When rotating, one supporting plate 201 drives the sleeve 302 to rotate, the sleeve 302 drives the connecting rod 301 in interference fit with the sleeve 302 to rotate, and the connecting rod 301 drives a first gear 4041 coaxially fixed to the connecting rod 301 to rotate.

When rotating, the first gear 4041 drives the gear set to rotate, and the gear set drives the other first gear 4041 to rotate. The connecting rod 301 fixed to the other first gear 4041 and the sleeve 302 in interference fit with the connecting rod 301 rotates, so as to drive the other supporting plate 201 to rotate.

The gear set may include an odd number of second gears 4042, two gears on the outermost side of the odd number of second gears 4042 are engaged with the two first gears 4041, and the odd number of second gears 4042 are engaged with each other. When one supporting plate 201 rotates towards a certain direction, one first gear 4041 drives the other first gear 4041 to rotate along a direction opposite to the certain direction through the transmission of the odd number of second gears 4042, so that two ends of the flexible display panel are bent towards two opposite directions.

The gear set may further include an even number of second gears 4042, two gears on the outermost side of the even number of second gears 4042 are engaged with the two first gears 4041, and the even number of second gears 4042 are engaged with each other. When one supporting plate 201 rotates towards a certain direction, one first gear 4041 drives the other first gear 4041 to rotate along a direction the same as the certain direction through the transmission of the even number of second gears 4042, so that two ends of the flexible display panel are bent towards two same directions. Specifically, the number of the second gears 4042 may be two, the two second gears 4042 are engaged with the two first gears 4041 in one to one correspondence, and the two second gears 4042 are engaged with each other.

The synchronous motion assembly 4 may further include a first connecting portion 401, the first connecting portion 401 is provided on the side of the supporting plate 201 close to an extending plate, and the first connecting portion 401 is provided to be perpendicular to the protrusion of the supporting plate 201. The synchronous motion assembly 4 may further include a second connecting portion 402, the second connecting portion 402 is provided as a plate shape, and the second connecting portion 402 is sleeved on the connecting rod 301 and extends towards the side close to the supporting plate 201 along the first direction. The second connecting portion 402 and the first connecting portion 401 are provided oppositely. The second connecting portion 402 is provided with a strip-shaped sliding groove 4011, the strip-shaped sliding groove 4011 gradually inclines towards the side away from the supporting plate 201 along the direction close to the mounting base 1. The first connecting portion 401 is provided with a mounting hole, and a pin shaft 403 is provided within the mounting hole. One end of the pin shaft 403 is fixed within the mounting hole, and the other end of the pin shaft 403 is slidably connected within the strip-shaped sliding groove 4011.

When rotating, the supporting plate 201 drives the pin shaft 403 to move within the strip-shaped sliding groove 4011. When moving to a certain position, the pin shaft 403 drives the sleeve 302 to rotate, so that the sleeve 302 can rotate synchronously with the supporting plate 201. The sleeve 302 drives the connecting rod 301 fitted with the sleeve 302 to rotate, and the first gear 4041 mounted on the connecting rod 301 rotates. Motion of the first gear 4041 is transferred to the other first gear 4041 through the gear set, and the other first gear 4041 drives the other connecting rod 301 to rotate, further driving the sleeve 302 fixed on the other connecting rod 301 to rotate. The sleeve 302 drives the corresponding supporting plate 201 to rotate so as to fold the flexible display panel connected to the two supporting plates 201. On the basis of the above, a row of first sawteeth may be provided within the strip-shaped sliding groove 4011, a circle of second sawteeth fitted with the first sawteeth may be provided on the pin shaft 403, and the second sawteeth may be fit with the first sawteeth to prevent the pin shaft 403 from sliding when rotating within the strip-shaped sliding groove 4011.

The region of the supporting plate 201 directly opposite to the sliding plate 202 and the elastic pressing mechanism 204 is lower than the remaining region of the supporting plate 201 to form a mounting cavity for providing the sliding plate 202 and the elastic pressing mechanism 204. The sliding plate 202 and the elastic pressing mechanism 204 are provided within the mounting cavity, and the thickness of the supporting plate 201 is not increased while the strength of the supporting plate 201 is ensured as much as possible. In addition, the rotating module 2 may further include a cover plate, and the cover plate is provided on the sides of the sliding plate 202 and the elastic pressing mechanism 204 away from the supporting plate 201.

There is provided a foldable flexible display device according to embodiments of the present disclosure. The foldable flexible display device includes the above rotating shaft mechanism.

It should be noted that, in addition to the rotating shaft mechanism, the foldable flexible display device further includes other necessary assemblies and components, specifically, such as a flexible display panel, a circuit board, a power line, a housing, etc., by taking the display as an example. Those skilled in the art may perform corresponding supplement according to the specific use requirements of the foldable flexible display device, and details are not described here again.

The foldable flexible display device may be a traditional electronic device, such as a mobile phone, a computer, a television, and a video recording and playing machine, or may be an emerging wearable device, such as VR glasses, which are not listed one by one.

Figures 7, 8:
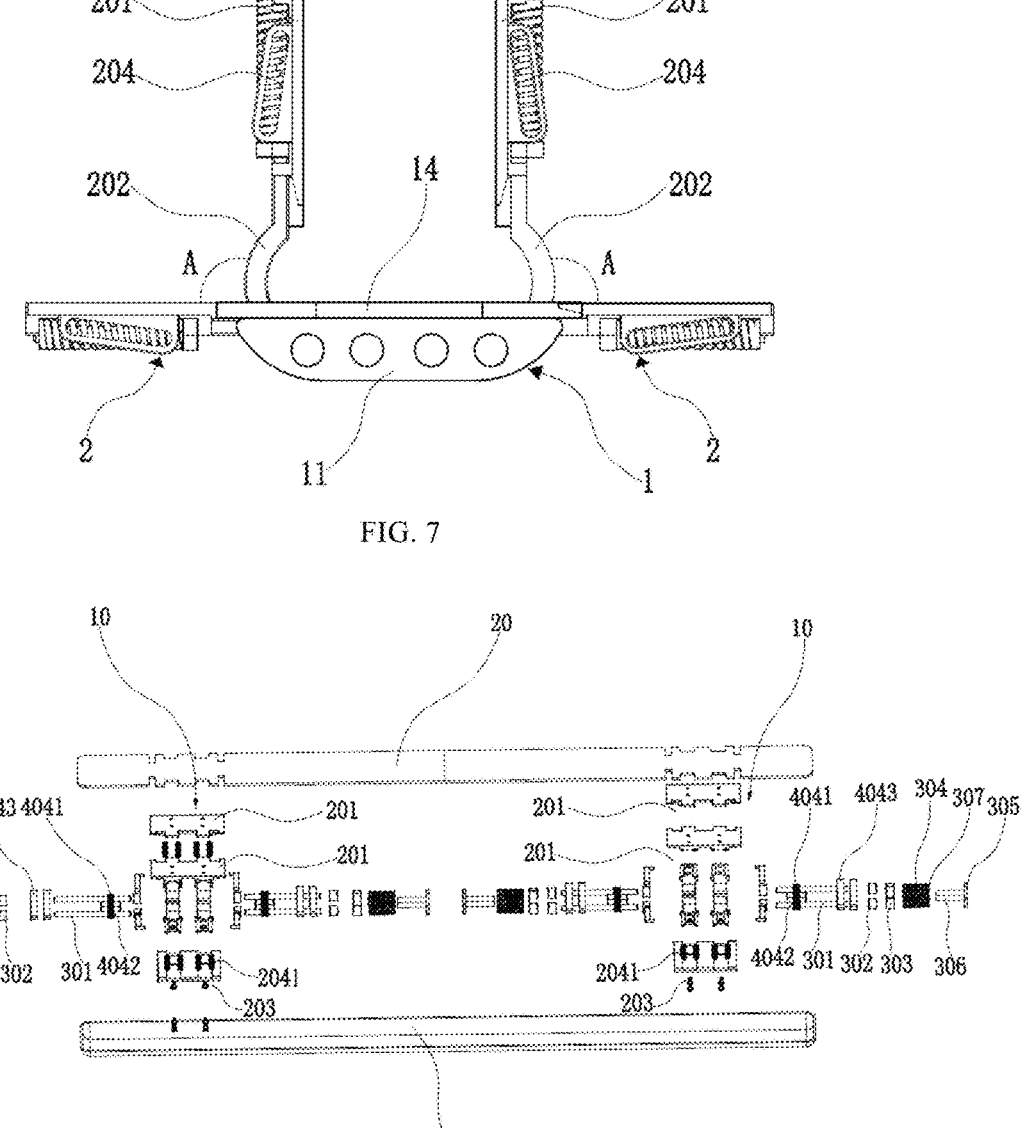
FIG. 7 is a schematic diagram of a rotation state of the rotating shaft mechanism according to some embodiments of the present disclosure.
FIG. 8 is an exploded view of a hinge mechanism according to some embodiments of the present disclosure.

As shown in FIG. 8, the foldable flexible display device generally includes two rotating shaft mechanisms 10, and may further include a connecting plate provided between the two rotating shaft mechanisms 10 along the second direction. The connecting plate is connected to the baffles of the two rotating shaft mechanisms 10 respectively to form the baffle structure 20. The foldable flexible display device further includes an encapsulation structure 30, and the encapsulation structure 30 is provided on the side of the rotating shaft mechanism 10 away from the baffle structure 20. The baffle structure 20, the two rotating shaft mechanisms 10, and the encapsulation structure 30 are assembled to form the hinge mechanism 100.

Figure 9:
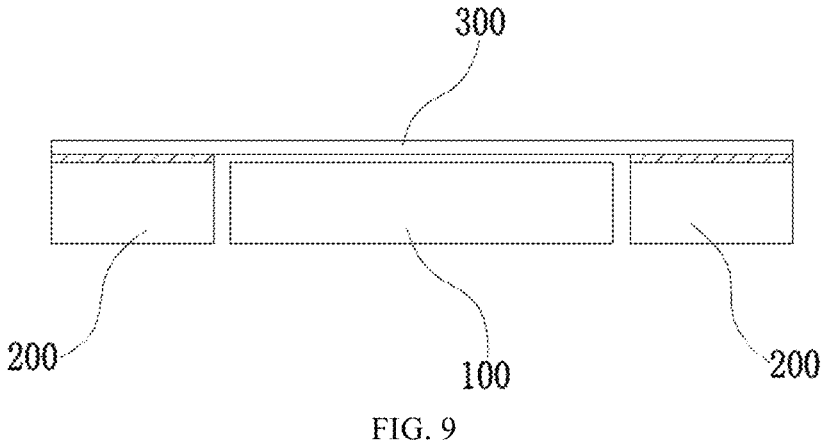
FIG. 9 is a schematic structural diagram of a foldable flexible display device according to some embodiments of the present disclosure.

As shown in FIG. 9, when the foldable flexible display device is a mobile phone, the foldable flexible display device further includes two middle frames 200 provided at intervals. The hinge mechanism 100 is fixedly connected to the two middle frames 200 respectively; specifically, the two supporting plates of the two rotating shaft mechanisms are fixedly connected to the two middle frames 200 respectively. The foldable flexible display device may further include a flexible display panel 300, the flexible display panel 300 is attached to the sides of the hinge mechanism 100 and the two middle frames 200 away from the mounting plate of the rotating shaft mechanism, and a rear housing of the mobile phone is provided on the sides of the two middle frames 200 away from the flexible display panel 300.

Other embodiments of the present disclosure will be apparent to those skilled in the art from consideration of the description and practice of the present disclosure. The present disclosure is intended to cover any variations, uses, or adaptations of the present disclosure following the general principles of the present disclosure and including common general knowledge or conventional technical means in the art not disclosed in the present disclosure. It is intended that the description and embodiments may be considered as examples only, with a true scope and spirit of the present disclosure being indicated by the appended claims.

What is claimed is:

1. A rotating shaft mechanism, comprising:

a mounting base; and at least one rotating assembly, wherein each rotating assembly comprises two rotating modules, the two rotating modules are symmetrically connected to two opposite sides of the mounting base along a first direction, and a rotating module comprises:

a supporting plate, rotatably connected to the mounting base, wherein a surface of the supporting plate is used for supporting a flexible display panel, another surface of the supporting plate directly opposite to the surface is provided with a first limiting portion and a second limiting portion, and the first limiting portion and the second limiting portion are provided at intervals along the first direction;

a sliding plate, wherein a portion of the sliding plate is rotatably connected to the mounting base, and another portion of the sliding plate is slidably connected to the supporting plate; an extending direction of a rotating axis of the sliding plate and an extending direction of a rotating axis of the supporting plate are both provided along a second direction and are parallel to each other; the second direction is perpendicular to the first direction; a portion of the sliding plate close to the mounting base is provided with a protruding portion; the protruding portion extends along the second direction and is located on a side of the first limiting portion close to the mounting base; and an end of the sliding plate away from the mounting base is opposite to the second limiting portion; and an elastic pressing mechanism, provided along the second direction, wherein an end of the elastic pressing mechanism is fixedly connected to the sliding plate, another end of the elastic pressing mechanism is slidably connected to the supporting plate, and the elastic pressing mechanism presses the sliding plate to enable the protruding portion to abut against the first limiting portion; the end of the sliding plate away from the mounting base is spaced apart from the second limiting portion; and a distance between the end of the sliding plate away from the mounting base and the second limiting portion is proportional to a maximum angle to which the supporting plate is able to rotate.

2. The rotating shaft mechanism according to claim 1, further comprising a torsion assembly, wherein the torsion assembly comprises:

a connecting rod, connected to the mounting base, wherein an extending direction of the connecting rod is provided along the second direction;

a sleeve, fixed to an outer side of the connecting rod, wherein the sleeve rotates synchronously with the supporting plate;

a pressing plate, sleeved on the connecting rod and fixed to a circumferential position of the connecting rod, wherein the pressing plate abuts against a side of the sleeve away from the mounting base;

a first elastic member, abutting against a side of the pressing plate away from the mounting base, wherein an end of the first elastic member away from the mounting base is fixedly provided; and a limiting structure, abutting against a side of the first elastic member away from the mounting base, wherein the limiting structure is fixed to the connecting rod;

wherein a positioning structure is provided between the pressing plate and the sleeve, so that when the sleeve stops rotating, the first elastic member presses the pressing plate to fix rotating positions of the pressing plate and the sleeve.

3. The rotating shaft mechanism according to claim 2, wherein the positioning structure comprises:

a plurality of grooves, provided on a surface of the pressing plate in contact with the sleeve along a circumferential direction; and a plurality of protrusions, provided on the sleeve and fitted with the plurality of grooves.

4. The rotating shaft mechanism according to claim 2, wherein the positioning structure comprises:

a plurality of grooves, provided on a surface of the sleeve in contact with the pressing plate along a circumferential direction; and a plurality of protrusions, provided on the pressing plate and fitted with the plurality of grooves.

5. The rotating shaft mechanism according to claim 2, wherein the limiting structure comprises:

a blocking member, sleeved on the connecting rod and abutting against the side of the first elastic member away from the mounting base; and a locking member, mounted on the connecting rod, wherein a clamping groove is provided on a side of the connecting rod away from the blocking member, and the locking member is provided within the clamping groove and abuts against a side of the blocking member away from the mounting base.

6. The rotating shaft mechanism according to claim 5, wherein the torsion assembly further comprises:

a guide post, fixed to a side of the blocking member close to the mounting base and passing through the pressing plate; and a second elastic member, sleeved outside the guide post and abutting against the blocking member and the pressing plate respectively.

7. The rotating shaft mechanism according to claim 1, wherein the elastic pressing mechanism is provided on two sides of the sliding plate along the second direction, and the elastic pressing mechanism comprises:

a mounting shaft, wherein an end of the mounting shaft is fixedly connected to a side of the protruding portion away from the mounting base, and another end of the mounting shaft is in clearance fit with the second limiting portion; and a third elastic member, sleeved outside the mounting shaft, wherein two ends of the third elastic member abut against the first limiting portion and the second limiting portion respectively.

8. The rotating shaft mechanism according to claim 2, further comprising a synchronous motion assembly, wherein the synchronous motion assembly is used for driving the connecting rod, the sleeve and the supporting plate of the two rotating modules to rotate synchronously.

9. The rotating shaft mechanism according to claim 8, wherein the synchronous motion assembly comprises a transmission mechanism, and the transmission mechanism comprises:

two first gears, connected to two connecting rods in one to one correspondence, wherein the first gears and the connecting rods are coaxially provided; and a gear set, engaged between the two first gears, wherein when one of the first gears rotates, the gear set drives the other one of the first gears to rotate.

10. The rotating shaft mechanism according to claim 9, wherein the gear set comprises:

two second gears, engaged with the two first gears in one to one correspondence, wherein the two second gears are engaged with each other.

11. The rotating shaft mechanism according to claim 9, wherein the synchronous motion assembly further comprises:

a first connecting portion, provided on the supporting plate, wherein the first connecting portion is provided with a strip-shaped sliding groove, and the strip-shaped sliding groove gradually inclines towards a side away from the supporting plate along a direction close to the mounting base;

a second connecting portion, sleeved on the connecting rod and extending towards a side close to the supporting plate along the first direction, wherein the second connecting portion is provided with a mounting hole; and a pin shaft, wherein an end of the pin shaft is fixed within the mounting hole, and another end of the pin shaft is slidably connected into the strip-shaped sliding groove.

12. The rotating shaft mechanism according to claim 1, wherein the mounting base is provided with an arc-shaped recess and an arc-shaped protrusion, an arc-shaped accommodating cavity is formed between the arc-shaped recess and the arc-shaped protrusion, a portion of the sliding plate connected to the mounting base is provided with an arc-shaped connecting portion, and the arc-shaped connecting portion is rotatably connected into the arc-shaped accommodating cavity.

13. The rotating shaft mechanism according to claim 1, wherein a portion of the sliding plate connected to the supporting plate is provided with a plurality of strip-shaped holes along the first direction, a limiting member is provided within each strip-shaped hole respectively, the limiting member is fixed to the supporting plate, and a distance between any two points on an end of the limiting member away from the sliding plate is larger than a width of the strip-shaped hole.

14. The rotating shaft mechanism according to claim 1, wherein the rotating module further comprises a cover plate, and the cover plate is provided on a side of the sliding plate and the elastic pressing mechanism away from the supporting plate.

15. The rotating shaft mechanism according to claim 1, wherein a region of the supporting plate directly opposite to the sliding plate and the elastic pressing mechanism is lower than a remaining region of the supporting plate to form a mounting cavity for providing the sliding plate and the elastic pressing mechanism.

16. The rotating shaft mechanism according to claim 1, wherein the rotating shaft mechanism comprises two rotating assemblies, and the two rotating assemblies are symmetrically provided on two sides of the mounting base along the second direction.

17. A foldable flexible display device, comprising a rotating shaft mechanism, wherein rotating shaft mechanism comprises:

a mounting base; and at least one rotating assembly, wherein each rotating assembly comprises two rotating modules, the two rotating modules are symmetrically connected to two opposite sides of the mounting base along a first direction, and a rotating module comprises:

a supporting plate, rotatably connected to the mounting base, wherein a surface of the supporting plate is used for supporting a flexible display panel, another surface of the supporting plate directly opposite to the surface is provided with a first limiting portion and a second limiting portion, and the first limiting portion and the second limiting portion are provided at intervals along the first direction;

a sliding plate, wherein a portion of the sliding plate is rotatably connected to the mounting base, and another portion of the sliding plate is slidably connected to the supporting plate; an extending direction of a rotating axis of the sliding plate and an extending direction of a rotating axis of the supporting plate are both provided along a second direction and are parallel to each other; the second direction is perpendicular to the first direction; a portion of the sliding plate close to the mounting base is provided with a protruding portion; the protruding portion extends along the second direction and is located on a side of the first limiting portion close to the mounting base; and an end of the sliding plate away from the mounting base is opposite to the second limiting portion; and an elastic pressing mechanism, provided along the second direction, wherein an end of the elastic pressing mechanism is fixedly connected to the sliding plate, another end of the elastic pressing mechanism is slidably connected to the supporting plate, and the elastic pressing mechanism presses the sliding plate to enable the protruding portion to abut against the first limiting portion; the end of the sliding plate away from the mounting base is spaced apart from the second limiting portion; and a distance between the end of the sliding plate away from the mounting base and the second limiting portion is proportional to a maximum angle to which the supporting plate is able to rotate.

18. The foldable flexible display device according to claim 17, wherein the rotating shaft mechanism further comprises a torsion assembly, and the torsion assembly comprises:

a connecting rod, connected to the mounting base, wherein an extending direction of the connecting rod is provided along the second direction;

a sleeve, fixed to an outer side of the connecting rod, wherein the sleeve rotates synchronously with the supporting plate;

a pressing plate, sleeved on the connecting rod and fixed to a circumferential position of the connecting rod, wherein the pressing plate abuts against a side of the sleeve away from the mounting base;

a first elastic member, abutting against a side of the pressing plate away from the mounting base, wherein an end of the first elastic member away from the mounting base is fixedly provided; and a limiting structure, abutting against a side of the first elastic member away from the mounting base, wherein the limiting structure is fixed to the connecting rod;

wherein a positioning structure is provided between the pressing plate and the sleeve, so that when the sleeve stops rotating, the first elastic member presses the pressing plate to fix rotating positions of the pressing plate and the sleeve.

19. The foldable flexible display device according to claim 17, wherein the elastic pressing mechanism is provided on two sides of the sliding plate along the second direction, and the elastic pressing mechanism comprises:

a mounting shaft, wherein an end of the mounting shaft is fixedly connected to a side of the protruding portion away from the mounting base, and another end of the mounting shaft is in clearance fit with the second limiting portion; and a third elastic member, sleeved outside the mounting shaft, wherein two ends of the third elastic member abut against the first limiting portion and the second limiting portion respectively.

20. The foldable flexible display device according to claim 17, wherein the mounting base is provided with an arc-shaped recess and an arc-shaped protrusion, an arc-shaped accommodating cavity is formed between the arc-shaped recess and the arc-shaped protrusion, a portion of the sliding plate connected to the mounting base is provided with an arc-shaped connecting portion, and the arc-shaped connecting portion is rotatably connected into the arc-shaped accommodating cavity.

* * * * *